US011932934B2

(12) United States Patent
Chong et al.

(10) Patent No.: US 11,932,934 B2
(45) Date of Patent: *Mar. 19, 2024

(54) METHOD FOR PARTICLE REMOVAL FROM WAFERS THROUGH PLASMA MODIFICATION IN PULSED PVD

(71) Applicant: Applied Materials, Inc., Santa Clara, CA (US)

(72) Inventors: Halbert Chong, San Jose, CA (US); Lei Zhou, San Jose, CA (US); Adolph Miller Allen, Oakland, CA (US); Vaibhav Soni, Sunnyvale, CA (US); Kishor Kalathiparambil, San Jose, CA (US); Vanessa Faune, Sacramento, CA (US); Song-Moon Suh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/941,137

(22) Filed: Sep. 9, 2022

(65) Prior Publication Data

US 2023/0002885 A1  Jan. 5, 2023

Related U.S. Application Data

(63) Continuation of application No. 16/787,569, filed on Feb. 11, 2020, now Pat. No. 11,473,189.

(Continued)

(51) Int. Cl.
*C23C 14/54* (2006.01)
*C23C 14/06* (2006.01)
(Continued)

(52) U.S. Cl.
CPC .......... *C23C 14/54* (2013.01); *C23C 14/0605* (2013.01); *C23C 14/35* (2013.01);
(Continued)

(58) Field of Classification Search
CPC ..... C23C 14/54; C23C 14/0605; C23C 14/35; C23C 14/564; H01J 37/3405;
(Continued)

(56) References Cited

U.S. PATENT DOCUMENTS 5,049,251 A     9/1991  Inoue et al.
5,367,139 A *  11/1994  Bennett ................... C23C 16/44
                                                            204/298.31

(Continued)

FOREIGN PATENT DOCUMENTS

CN      103534380 A     1/2014
CN      106011788 A    10/2016
(Continued)

OTHER PUBLICATIONS

PCT International Search Report and Written Opinion in PCT/US2020/017633 dated Jun. 12, 2020, 11 pages.

*Primary Examiner* — Nicholas A Smith
*Assistant Examiner* — Patrick S Ott
(74) *Attorney, Agent, or Firm* — Servilla Whitney LLC

(57) ABSTRACT

Physical vapor deposition methods for reducing the particulates deposited on the substrate are disclosed. The pressure during sputtering can be increased to cause agglomeration of the particulates formed in the plasma. The agglomerated particulates can be moved to an outer portion of the process chamber prior to extinguishing the plasma so that the agglomerates fall harmlessly outside of the diameter of the substrate.

17 Claims, 6 Drawing Sheets

Related U.S. Application Data

(60) Provisional application No. 62/804,144, filed on Feb. 11, 2019.

(51) Int. Cl.
*C23C 14/35* (2006.01)
*H01J 37/34* (2006.01)

(52) U.S. Cl.
CPC ...... *H01J 37/3405* (2013.01); *H01J 37/3426* (2013.01); *H01J 37/3467* (2013.01); *H01J 37/3455* (2013.01); *H01J 2237/002* (2013.01); *H01J 2237/332* (2013.01)

(58) Field of Classification Search
CPC ............... H01J 37/3426; H01J 37/3467; H01J 37/3455; H01J 2237/002; H01J 2237/332
See application file for complete search history.

(56) References Cited

U.S. PATENT DOCUMENTS

| | | | |
|---|---|---|---|
| 5,510,011 A * | 4/1996 | Okamura | H01L 29/66287 117/108 |
| 5,573,597 A | 11/1996 | Lantsman | |
| 6,013,159 A * | 1/2000 | Adams | H01J 37/3408 204/192.12 |
| 6,361,662 B1 * | 3/2002 | Chiba | H01L 29/665 257/E21.199 |
| 11,473,189 B2 * | 10/2022 | Chong | H01J 37/3467 |
| 2001/0009730 A1 * | 7/2001 | Futamoto | G11B 5/66 428/832 |
| 2003/0025121 A1 | 2/2003 | Edmond et al. | |
| 2003/0113588 A1 * | 6/2003 | Uwazumi | C23C 14/34 428/836.3 |
| 2005/0051421 A1 | 3/2005 | Quesnel et al. | |
| 2005/0227500 A1 * | 10/2005 | Sugawara | H01J 37/32192 438/785 |
| 2006/0051966 A1 | 3/2006 | Or | |
| 2007/0212895 A1 * | 9/2007 | Chua | H01L 21/28185 438/758 |
| 2008/0157007 A1 | 7/2008 | Nunan et al. | |
| 2009/0068450 A1 | 3/2009 | Muenz | |
| 2009/0200158 A1 | 8/2009 | Ehiasarian | |
| 2009/0263566 A1 | 10/2009 | Ohmi et al. | |
| 2010/0068444 A1 | 3/2010 | Asplund et al. | |
| 2010/0101602 A1 | 4/2010 | Deehan | |
| 2010/0288302 A1 | 11/2010 | Ehm et al. | |
| 2011/0005920 A1 | 1/2011 | Ivanov | |
| 2011/0248633 A1 * | 10/2011 | Nauman | H01J 37/3429 315/246 |
| 2013/0276984 A1 | 10/2013 | Papa | |
| 2013/0277203 A1 | 10/2013 | Rasheed et al. | |
| 2014/0027269 A1 | 1/2014 | Helmersson et al. | |
| 2014/0262748 A1 | 9/2014 | Tietema | |
| 2014/0283872 A1 | 9/2014 | Deehan | |
| 2014/0305792 A1 | 10/2014 | Krassnitzer | |
| 2015/0001063 A1 | 1/2015 | Dkrassnitzer | |
| 2015/0047975 A1 * | 2/2015 | West | H01J 37/3491 204/298.12 |
| 2016/0222503 A1 | 8/2016 | Kamruzzaman et al. | |
| 2017/0372899 A1 * | 12/2017 | Yang | H01L 21/02274 |
| 2018/0151325 A1 | 5/2018 | Allen et al. | |
| 2018/0209035 A1 * | 7/2018 | Liu | C23C 14/48 |
| 2018/0330931 A1 | 11/2018 | Krassnitzer | |

FOREIGN PATENT DOCUMENTS

| | | |
|---|---|---|
| EP | 2954092 B1 | 4/2017 |
| TW | 201344744 A | 11/2013 |
| TW | 201638367 A | 11/2016 |
| WO | 2006069085 A2 | 6/2006 |
| WO | 2007054048 A1 | 5/2007 |
| WO | 2008148673 A1 | 12/2008 |
| WO | 2010127845 A1 | 11/2010 |
| WO | 2012143110 A1 | 10/2012 |
| WO | 2017003339 A1 | 1/2017 |
| WO | 2018231837 A1 | 12/2018 |

\* cited by examiner

METHOD FOR PARTICLE REMOVAL FROM WAFERS THROUGH PLASMA MODIFICATION IN PULSED PVD

CROSS-REFERENCE TO RELATED APPLICATIONS

This application is a Continuation Application of U.S. application Ser. No. 16/787,569, filed Feb. 11, 2020, which claims priority to U.S. Provisional Application No. 62/804,144, filed Feb. 11, 2019, the entire disclosures of which are hereby incorporated by reference herein.

TECHNICAL FIELD

The present disclosure relates generally to substrate processing systems, and more specifically, to physical vapor deposition (PVD) processing systems.

BACKGROUND

Sputtering, alternatively called physical vapor deposition (PVD), has long been used in depositing metals and related materials in the fabrication of semiconductor integrated circuits. Use of sputtering has been extended to depositing metal layers onto the sidewalls of high aspect-ratio holes such as vias or other vertical interconnect structures, as well as in the manufacture of extreme ultraviolet (EUV) mask blanks. In the manufacture of EUV mask blanks minimization of particle generation is desired, because particles negatively impact the properties of the final product.

Plasma sputtering may be accomplished using either DC sputtering or RF sputtering. Plasma sputtering typically includes a magnetron positioned at the back of the sputtering target to project a magnetic field into the processing space to increase the density of the plasma and enhance the sputtering rate. Magnets used in the magnetron are typically closed loop for DC sputtering and open loop for RF sputtering.

Agglomerated charged particles are typically not an issue observed in physical vapor deposition. Recently, large particles on wafers have been observed in some pulsed PVD chambers. There is need to provide apparatus and methods to prevent or minimize particulate damage to sputtered substrates.

SUMMARY

One or more embodiments of the disclosure are directed to physical vapor deposition methods. A film is deposited on a substrate surface in a magnetron physical vapor deposition chamber with a plasma at a deposition pressure and creating particles in the plasma. The pressure in the physical vapor deposition chamber in increased to a particulate purge pressure greater than the deposition pressure to move at least some of the particles to an outer portion of the physical vapor deposition chamber. The plasma can then be extinguished.

Additional embodiments of the disclosure are directed to physical vapor deposition methods comprising positioning a substrate having a substrate surface on a pedestal in a magnetron physical vapor deposition chamber. A deposition plasma is generated at a deposition pressure in the chamber to deposit a film on the substrate surface and create particulates in the plasma. The pressure in the chamber is increased to a particulate purge pressure greater than the deposition pressure to agglomerate particulates in the plasma and move the agglomerated particulates to an outer portion of the physical vapor deposition chamber.

Further embodiments of the disclosure are directed to physical vapor deposition methods comprising positioning a substrate having a substrate surface on a pedestal in a magnetron physical vapor deposition chamber. The magnetron physical vapor deposition chamber comprises a carbon target with a flow of krypton. A film is deposited on the substrate surface by generating a deposition plasma at a deposition pressure less than or equal to about 40 mtorr in the chamber, depositing the film creates particulates in the plasma. Particulates falling on the substrate surface are decreased by increasing pressure in the chamber to a particulate purge pressure greater than or equal to about 70 mtorr to agglomerate particulates in the plasma and move the agglomerated particulates to an outer portion of the physical vapor deposition chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that can react with the substrate surface.

Those skilled in the art will understand that the use of ordinals such as "first" and "second" to describe process regions do not imply a specific location within the processing chamber, or order of exposure within the processing chamber.

Figure 1:
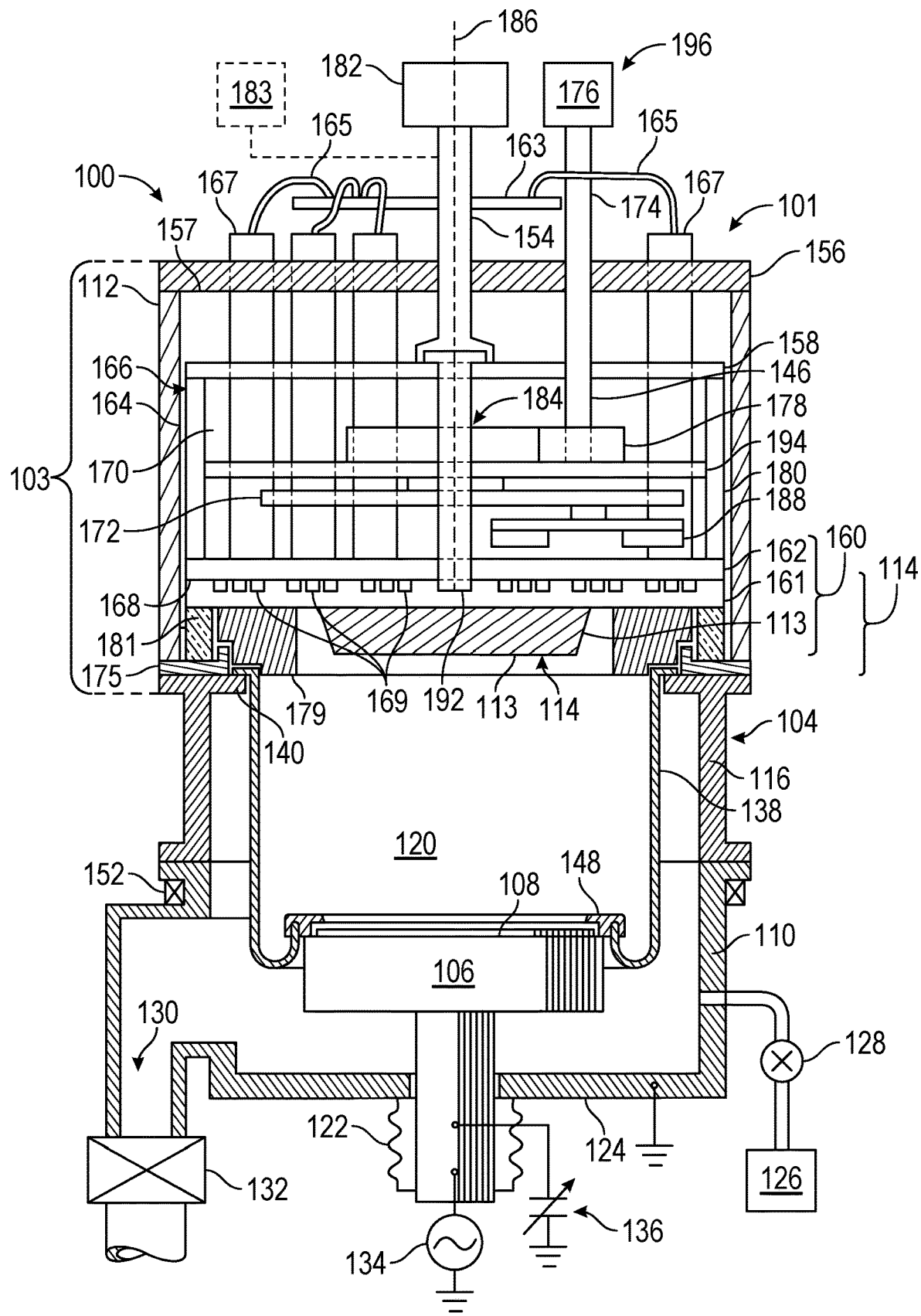
FIG. 1 depicts a schematic cross-sectional view of a process chamber in accordance with some embodiments of the present disclosure.

FIG. 1 depicts a simplified, cross-sectional view of a physical vapor deposition (PVD) processing system 100 in accordance with some embodiments of the present disclosure. Examples of other PVD chambers suitable for modification in accordance with the teachings provided herein include the ALPS® Plus and SIP ENCORE® PVD processing chambers, both commercially available from Applied Materials, Inc., of Santa Clara, Calif. Other processing chambers from Applied Materials, Inc. or other manufactures, including those configured for other types of processing besides PVD, may also benefit from modifications in accordance with the teachings disclosed herein.

In some embodiments of the present disclosure, the PVD processing system 100 includes a chamber body 101 removably disposed atop a process chamber 104. The chamber body 101 may include a target assembly 114 and a grounding assembly 103. The process chamber 104 contains a substrate support 106 for receiving a substrate 108 thereon. The substrate support 106 may be located within a lower grounded enclosure wall 110, which may be a chamber wall of the process chamber 104. The lower grounded enclosure wall 110 may be electrically coupled to the grounding assembly 103 of the chamber body 101 such that an RF return path is provided to an RF or DC power source 182 disposed above the chamber body 101. The RF or DC power source 182 may provide RF or DC power to the target assembly 114 as discussed below.

The substrate support 106 has a material-receiving surface facing a principal surface of a target assembly 114 and supports the substrate 108 to be sputter coated in planar position opposite to the principal surface of the target assembly 114. The substrate support 106 may support the substrate 108 in a central region 120 of the process chamber 104. The central region 120 is defined as the region above the substrate support 106 during processing (for example, between the target assembly 114 and the substrate support 106 when in a processing position).

In some embodiments, the substrate support 106 may be vertically movable to allow the substrate 108 to be transferred onto the substrate support 106 through a load lock valve (not shown) in the lower portion of the process chamber 104 and thereafter raised to a deposition, or processing position. A bellows 122 connected to a bottom chamber wall 124 may be provided to maintain a separation of the inner volume of the process chamber 104 from the atmosphere outside of the process chamber 104 while facilitating vertical movement of the substrate support 106. One or more gases may be supplied from a gas source 126 through a mass flow controller 128 into the lower part of the process chamber 104. An exhaust port 130 may be provided and coupled to a pump (not shown) via a valve 132 for exhausting the interior of the process chamber 104 and to facilitate maintaining a desired pressure inside the process chamber 104.

An RF bias power source 134 may be coupled to the substrate support 106 in order to induce a negative DC bias on the substrate 108. In addition, in some embodiments, a negative DC self-bias may form on the substrate 108 during processing. For example, RF energy supplied by the RF bias power source 134 may range in frequency from about 2 MHz to about 60 MHz, for example, non-limiting frequencies such as 2 MHz, 13.56 MHz, or 60 MHz can be used. In other applications, the substrate support 106 may be grounded or left electrically floating. Alternatively or in combination, a capacitance tuner 136 may be coupled to the substrate support 106 for adjusting voltage on the substrate 108 for applications where RF bias power may not be desired.

The process chamber 104 further includes a process kit shield, or shield 138 to surround the processing volume, or central region 120 of the process chamber 104 and to protect other chamber components from damage and/or contamination from processing. In some embodiments, the shield 138 may be connected to a ledge 140 of an upper grounded enclosure wall 116 of the process chamber 104. As illustrated in FIG. 1, the chamber body 101 may rest on the ledge 140 of the upper grounded enclosure wall 116. Similar to the lower grounded enclosure wall 110, the upper grounded enclosure wall 116 may provide a portion of the RF return path between the lower grounded enclosure wall 116 and the grounding assembly 103 of the chamber body 101. However, other RF return paths are possible, such as via the grounded shield 138.

The shield 138 extends downwardly and may include a generally tubular portion having a generally constant diameter that generally surrounds the central region 120. The shield 138 extends along the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138). A cover ring 148 rests on the top of an upwardly extending inner portion of the shield 138 when the substrate support 106 is in its lower, loading position but rests on the outer periphery of the substrate support 106 when it is in its upper, deposition position to protect the substrate support 106 from sputter deposition. An additional deposition ring (not shown) may be used to protect the edges of the substrate support 106 from deposition around the edge of the substrate 108.

In some embodiments, a magnet 152 may be disposed about the process chamber 104 to selectively provide a magnetic field between the substrate support 106 and the target assembly 114. For example, as shown in FIG. 1, the magnet 152 may be disposed about the outside of the enclosure wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber body 101 generally includes the grounding assembly 103 disposed about the target assembly 114. The grounding assembly 103 may include a grounding plate 156 having a first surface 157 that may be generally parallel to and opposite a backside of the target assembly 114. A grounding shield 112 may extend from the first surface 157 of the grounding plate 156 and surround the target assembly 114. The grounding assembly 103 may include a support member 175 to support the target assembly 114 within the grounding assembly 103.

In some embodiments, the support member 175 may be coupled to a lower end of the grounding shield 112 proximate an outer peripheral edge of the support member 175 and extends radially inward to support a seal ring 181, the target assembly 114 and optionally, a dark space shield 179. The seal ring 181 may be a ring or other annular shape having a desired cross-section. The seal ring 181 may include two opposing planar and generally parallel surfaces to facilitate interfacing with the target assembly 114, such as the backing plate assembly 160, on a first side of the seal ring 181 and with the support member 175 on a second side of the seal ring 181. The seal ring 181 may be made of a dielectric material, such as ceramic. The seal ring 181 may insulate the target assembly 114 from the ground assembly 103.

The dark space shield 179 is generally disposed about an outer edge of the target assembly 114, such about an outer edge of a source material 113 of the target assembly 114. In some embodiments, the seal ring 181 is disposed adjacent to an outer edge of the dark space shield 179 (i.e., radially outward of the dark space shield 179). In some embodiments, the dark space shield 179 is made of a dielectric material, such as ceramic. By providing a dark space shield 179, arcing between the dark space shield and adjacent components that are RF hot may be avoided or minimized. Alternatively, in some embodiments, the dark space shield 179 is made of a conductive material, such as stainless steel, aluminum, or the like. By providing a conductive dark space shield 179 a more uniform electric field may be maintained within the PVD processing system 100, thereby promoting more uniform processing of substrates therein. In some embodiments, a lower portion of the dark space shield 179 may be made of a conductive material and an upper portion of the dark space shield 179 may be made of a dielectric material.

The support member 175 may be a generally planar member having a central opening to accommodate the dark space shield 179 and the target assembly 114. In some embodiments, the support member 175 may be circular, or disc-like in shape, although the shape may vary depending upon the corresponding shape of the chamber lid and/or the shape of the substrate to be processed in the PVD processing system 100. In use, when the chamber body 101 is opened or closed, the support member 175 maintains the dark space shield 179 in proper alignment with respect to the target assembly 114, thereby minimizing the risk of misalignment due to chamber assembly or opening and closing the chamber body 101.

The PVD processing system 100 may include a source distribution plate 158 opposing a backside of the target assembly 114 and electrically coupled to the target assembly 114 along a peripheral edge of the target assembly 114. The target assembly 114 may comprise a source material 113 to be deposited on a substrate, such as the substrate 108 during sputtering, such as a metal, metal oxide, metal alloy, or the like. In one or more embodiments, the target assembly 114 includes a backing plate assembly 160 to support the source material 113. The source material 113 may be disposed on a substrate support facing side of the backing plate assembly 160 as illustrated in FIG. 1. The backing plate assembly 160 may comprise a conductive material, such as copper-zinc, copper-chrome, or the same material as the target, such that RF and DC power can be coupled to the source material 113 via the backing plate assembly 160. Alternatively, the backing plate assembly 160 may be non-conductive and may include conductive elements (not shown) such as electrical feedthroughs or the like.

In one or more embodiments, the backing plate assembly 160 includes a backing plate 161 and a cover plate 162. The backing plate 161 and the cover plate 162 may be disc shaped, rectangular, square, or any other shape that may be accommodated by the PVD processing system 100. A front side of the backing plate is configured to support the source material 113 such that a front surface of the source material opposes the substrate 108 when present. The source material 113 may be coupled to the backing plate 161 in any suitable manner. For example, in some embodiments, the source material 113 may be diffusion bonded to the backing plate 161.

A plurality of channels 169 may be disposed between the backing plate 161 and the cover plate 162. In one or more embodiments, the backing plate 161 may have the plurality of channels 169 formed in a backside of the backing plate 161 with the cover plate 162 providing a cap/cover over each of the channels. In other embodiments, the plurality of channels 169 may be formed partially in the backing plate 161 and partially in the cover plate 162. Still, in other embodiments, the plurality of channels 169 may be formed entirely in the cover plate 162, while the backing plate caps/covers each of the plurality of channels 169. The backing plate 161 and the cover plate 162 may be coupled together.

In some embodiments, the cover plate 162 is eliminated, and the backing plate 161 is a monolithic material. Such a backing plate 161 of monolithic material can be formed by 3D printing, and the plurality of channels 169 are formed during the 3D printing process. In some embodiments, the plurality of channels 169 are configured to flow cooling fluid, and the backing plate 161 and the cover plate 162 are coupled together to form a substantially water tight seal (e.g., a fluid seal between the backing plate 161 and the cover plates 162) to prevent leakage of coolant provided to the plurality of channels 169. That is, the cooling fluid is in direct contact with the channels 169. For example, in some embodiments, the backing plate 161 and the cover plate 162 are brazed together to form a substantially water tight seal or they may be coupled by diffusion bonding, brazing, gluing, pinning, riveting, or any other fastening means to provide a liquid seal, and the channels 169 formed between the backing plate 161 and the cover plate 162 directly contact cooling fluid. However, in other embodiments, the backing plate 161 has the plurality of channels 169 machined therein. The cover plate 162 is then optionally machined (or not machined). Brazing paste is placed between the backing plate 161 and the cover plate 162. Electron beam (E-beam) welding is then utilized to fasten the backing plate 161 and the cover plate 162 together. Thereafter, the fastened components can be heated to complete the fastening process, and then the fastened components may be machined to the final tolerance and specifications. Then the source material in the form of a target can be bonded to the backing plate 161 or cover plate 162 with indium solder. As will be described further below, according to some embodiments of the instant disclosure, a fluid tight seal between the backing plate 161 and the cover plate 162 is not necessary because the cooling fluid is contained within tubing which is disposed within the channels 169.

The backing plate 161 and the cover plate 162 may comprise an electrically conductive material, such as an electrically conductive metal or metal alloy including brass, aluminum, copper, aluminum alloys, copper alloys, or the like. In some embodiments, the backing plate 161 may be a machinable metal or metal alloy (e.g., C18200 chromium copper alloy) such that the channels may be machined or otherwise created on a surface of the backing plate 161. In some embodiments, the cover plate 162 may be a machinable metal or metal alloy, (e.g., C18200 chromium copper alloy) having a stiffness/elastic modulus greater than the metal or metal alloy of the backing plate to provide improved stiffness and lower deformation of backing plate assembly 160. The materials and sizes of the backing plate 161 and the cover plate 162 should be such that the stiffness of the entire backing plate assembly 160 will withstand the vacuum, gravitational, thermal, and other forces exerted on the target assembly 114 during deposition process, without (or with very little) deformation or bowing of the target assembly 114 including the source material 113 (i.e., such that the front of surface source material 113 remains substantially parallel to the top surface of a substrate 108).

In some embodiments, the overall thickness of the target assembly 114 may be between about 20 mm to about 100 mm. For example, the source material 113 may be about 10 to about 15 mm thick and the backing plate assembly may be about 10 to about 30 mm thick. Other thicknesses may also be used.

The plurality of channels 169 may include one or more sets of channels (discussed in detail below). For example, in some exemplary embodiments there may one set of channels. In other embodiments, there may two or more sets of channels. The size and cross-sectional shape of each channel, as well as the number of channels in each set and number of channels may be optimized based on one or more of the following characteristics: to provide a desired maximum flow rate through the channel and in total through all channels; to provide maximum heat transfer characteristics; ease and consistency in manufacturing channels within the backing plate 161 and the cover plate 162; to provide the most heat exchange flow coverage over the surfaces of the backing plate assembly 160 while retaining enough structural integrity to prevent deformation of the backing plate assembly 160 under load, etc. In some embodiments, the cross-sectional shape of each channel may be rectangular, polygonal, elliptical, circular, and the like.

In some embodiments, the target assembly includes one or more inlets (not shown in FIG. 1 and discussed in detail below) fluidly coupled with the channels 169 or with tubing. The one or more inlets are configured to receive a heat exchange fluid and to provide the heat exchange fluid to the plurality of channels 169 or to the tubing. For example, at least one of the one or more inlets may be a plenum to distribute the heat exchange fluid to the plurality of channels 169 or to tubing. The assembly further includes one or more outlets (not shown in FIG. 1 and discussed in detail below) disposed through the cover plate 162 and fluidly coupled to a corresponding inlet by the plurality of channels 169 or tubing. For example, at least one of the one or more outlets may be a plenum to collect the heat exchange fluid from a plurality of the one or more channels or tubing. In some embodiments, one inlet and one outlet are provided and each set of channels in the plurality of set of channels 169 is fluidly coupled to the one inlet and the one outlet.

The inlets and outlets may be disposed on or near a peripheral edge of the cover plate 162 or backing plate 161. In addition, the inlets and outlets may be disposed on the cover plate 162 such that supply conduits 167 coupled to the one or more inlets, and return conduits coupled to the one or more outlets, do not interfere with the rotation of a magnetron assembly 196 in cavity 170. In other embodiments, the inlets and outlets may be disposed on the backing plate 161 such that supply conduits 167 coupled to the one or more inlets, and return conduits (not shown due to cross section) coupled to the one or more outlets, do not interfere with the rotation of a magnetron assembly 196 in cavity 170. In still other embodiments, the inlets and outlets may be coupled to tubing such that supply conduits 167 coupled to the one or more inlets, and return conduits (not shown due to cross section), coupled to the one or more outlets, do not interfere with the rotation of a magnetron assembly 196 in cavity 170.

In some embodiments, PVD processing system 100 may include one or more supply conduits 167 to supply heat exchange fluid to the backing plate assembly 160. In some embodiments, each inlet may be coupled to a corresponding supply conduit 167. Similarly, each outlet may be coupled to a corresponding return conduit. Supply conduits 167 and return conduits may be made of insulating materials. The supply conduit 167 may include a seal ring (e.g., a compressible o-ring or similar gasket material) to prevent heat exchange fluid leakage between the supply conduit 167 and an inlet. In some embodiments, a top end of supply conduits 167 may be coupled to a fluid distribution manifold 163 disposed on the top surface of the chamber body 101. The fluid distribution manifold 163 may be fluidly coupled to the plurality of supply conduits 167 to supply heat exchange fluid to each of the plurality of supply conduits via supply lines 165. Similarly, a top end of return conduits may be coupled to a return fluid manifold (not shown, but similar to 163) disposed on the top surface of the chamber body 101. The return fluid manifold may be fluidly coupled to the plurality of return conduits to return heat exchange fluid from each of the plurality of return conduits via return lines.

The fluid distribution manifold 163 may be coupled to a heat exchange fluid source (not shown) to provide a heat exchange fluid in the form of a liquid to the backing plate assembly 160. The heat exchange fluid may be any process compatible liquid coolant, such as ethylene glycol, deionized water, a perfluorinated polyether (such as Galden®, available from Solvay S. A.), or the like, or solutions or combinations thereof. In some embodiments, the flow of coolant through the channels 169 or tubing may be about 8 to about 20 gallons per minute, in sum total, although the exact flows will depend upon the configuration of the coolant channels, available coolant pressure, or the like.

A conductive support ring 164, having a central opening, is coupled to a backside of the cover plate 162 along a peripheral edge of the cover plate 162. In some embodiments, in place of separate supply and return conduits, the conductive support ring 164 may include a ring inlet to receive heat exchange fluid from a fluid supply line (not shown). The conductive support ring 164 may include an inlet manifold, disposed within the body of the conductive support ring 164, to distribute the heat exchange fluid to an inlet connected to tubing or the channels 169. The conductive support ring 164 may include an outlet manifold, disposed within the body of the conductive support ring 164, to receive the heat exchange fluid from one or more outlets, and a ring outlet to output the heat exchange fluid from the conductive support ring 164. The conductive support ring 164 and the backing plate assembly 160 may be threaded together, pinned, bolted, or fastened in a process compatible manner to provide a liquid seal between the conductive support ring 164 and the cover plate 162. O-rings or other suitable gasket materials may be provided to facilitate providing a seal between the conductive support ring 164 and the cover plate 162.

In some embodiments, the target assembly 114 may further comprise a central support member 192 to support the target assembly 114 within the chamber body 101. The central support member 192 may be coupled to a center portion of the backing plate 161 and the cover plate 162 and extend perpendicularly away from the backside of the cover plate 162. In some embodiments, a bottom portion of the central support member 192 may be threaded into a central opening in the backing plate 161 and the cover plate 162. In other embodiments, a bottom portion of the central support member 192 may be bolted or clamped to a central portion of the backing plate 161 and the cover plate 162. A top portion of the central support member 192 may be disposed through the source distribution plate 158 and includes a feature which rests on a top surface of the source distribution plate 158 that supports the central support member 192 and target assembly 114.

In some embodiments, the conductive support ring 164 may be disposed between the source distribution plate 158 and the backside of the target assembly 114 to propagate RF energy from the source distribution plate to the peripheral edge of the target assembly 114. The conductive support ring 164 may be cylindrical, with a first end 166 coupled to a target-facing surface of the source distribution plate 158 proximate the peripheral edge of the source distribution plate 158 and a second end 168 coupled to a source distribution plate-facing surface of the target assembly 114 proximate the peripheral edge of the target assembly 114. In some embodiments, the second end 168 is coupled to a source distribution plate facing surface of the backing plate assembly 160 proximate the peripheral edge of the backing plate assembly 160.

The PVD processing system 100 may include a cavity 170 disposed between the backside of the target assembly 114 and the source distribution plate 158. The cavity 170 may at least partially house the magnetron assembly 196 as discussed below. The cavity 170 is at least partially defined by the inner surface of the conductive support ring 164, a target facing surface of the source distribution plate 158, and a source distribution plate facing surface (e.g., backside) of the target assembly 114 (or backing plate assembly 160).

An insulative gap 180 is provided between the grounding plate 156 and the outer surfaces of the source distribution plate 158, the conductive support ring 164, and the target assembly 114 (and/or backing plate assembly 160). The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 may be between about 15 mm and about 40 mm.

The grounding assembly 103 and the target assembly 114 may be electrically separated by the seal ring 181 and by one or more of insulators (not shown) disposed between the first surface 157 of the grounding plate 156 and the backside of the target assembly 114, e.g., a non-target facing side of the source distribution plate 158.

The PVD processing system 100 has an RF or DC power source 182 connected to an electrode 154 (e.g., a RF feed structure). The electrode 154 may pass through the grounding plate 156 and is coupled to the source distribution plate 158. The RF or DC power source 182 may include an RF generator and a matching circuit, for example, to minimize reflected RF energy reflected back to the RF generator during operation. For example, RF energy supplied by the RF or DC power source 182 may range in frequency from about 13.56 MHz to about 162 MHz or above. For example, non-limiting frequencies such as 13.56 MHz, 27.12 MHz, 40.68 MHz, 60 MHz, or 162 MHz can be used.

In some embodiments, the PVD processing system 100 may include a second energy source 183 to provide additional energy to the target assembly 114 during processing. In some embodiments, the second energy source 183 may be a DC power source to provide DC energy, for example, to enhance a sputtering rate of the target material (and hence, a deposition rate on the substrate). In some embodiments, the second energy source 183 may be a second RF power source, similar to the RF or DC power source 182, to provide RF energy, for example, at a second frequency different than a first frequency of RF energy provided by the RF or DC power source 182. In embodiments where the second energy source 183 is a DC power source, the second energy source may be coupled to target assembly 114 in any location suitable to electrically couple the DC energy to the target assembly 114, such as the electrode 154 or some other conductive member (such as the source distribution plate 158, discussed below). In embodiments where the second energy source 183 is a second RF power source, the second energy source may be coupled to the target assembly 114 via the electrode 154.

The electrode 154 may be cylindrical or otherwise rod-like and may be aligned with a central axis 186 of the PVD processing system 100 (e.g., the electrode 154 may be coupled to the target assembly at a point coincident with a central axis of the target, which is coincident with the central axis 186). The electrode 154, aligned with the central axis 186 of the PVD processing system 100, facilitates applying RF energy from the RF or DC power source 182 to the target assembly 114 in an axisymmetrical manner (e.g., the electrode 154 may couple RF energy to the target at a single point aligned with the central axis of the PVD chamber). The central position of the electrode 154 helps to eliminate or reduce deposition asymmetry in substrate deposition processes. The electrode 154 may have any suitable diameter. For example, although other diameters may be used, in some embodiments, the diameter of the electrode 154 may be about 0.5 to about 2 inches. The electrode 154 may generally have any suitable length depending upon the configuration of the PVD chamber. In some embodiments, the electrode may have a length of between about 0.5 to about 12 inches. The electrode 154 may be fabricated from any suitable conductive material, such as aluminum, copper, silver, or the like. Alternatively, in some embodiments, the electrode 154 may be tubular. In some embodiments, the diameter of the tubular electrode 154 may be suitable, for example, to facilitate providing a central shaft for the magnetron.

The electrode 154 may pass through the ground plate 156 and is coupled to the source distribution plate 158. The ground plate 156 may comprise any suitable conductive material, such as aluminum, copper, or the like. The open spaces between the one or more insulators (not shown) allow for RF wave propagation along the surface of the source distribution plate 158. In some embodiments, the one or more insulators may be symmetrically positioned with respect to the central axis 186 of the PVD processing system. Such positioning may facilitate symmetric RF wave propagation along the surface of the source distribution plate 158 and, ultimately, to a target assembly 114 coupled to the source distribution plate 158. The RF energy may be provided in a more symmetric and uniform manner as compared to conventional PVD chambers due, at least in part, to the central position of the electrode 154.

One or more portions of a magnetron assembly 196 may be disposed at least partially within the cavity 170. The magnetron assembly provides a rotating magnetic field proximate the target to assist in plasma processing within the chamber body 101. In some embodiments, the magnetron assembly 196 may include a motor 176, a motor shaft 174, a gear box 178, a gear box shaft assembly 184, and a rotatable magnet (e.g., a plurality of magnets 188 coupled to a magnet support member 172), and divider 194. In some embodiments, the magnetron assembly 196 remains stationary.

In some embodiments, the magnetron assembly 196 is rotated within the cavity 170. For example, in some embodiments, the motor 176, motor shaft 174, gear box 178, and gear box shaft assembly 184 may be provided to rotate the magnet support member 172. In conventional PVD chambers having magnetrons, the magnetron drive shaft is typically disposed along the central axis of the chamber, preventing the coupling of RF energy in a position aligned with the central axis of the chamber. In one or more embodiments, the electrode 154 is aligned with the central axis 186 of the PVD chamber. As such, in some embodiments, the motor shaft 174 of the magnetron may be disposed through an off-center opening in the ground plate 156. The end of the motor shaft 174 protruding from the ground plate 156 is coupled to a motor 176. The motor shaft 174 is further disposed through a corresponding off-center opening through the source distribution plate 158 (e.g., a first opening 146) and coupled to a gear box 178. In some embodiments, one or more second openings (not shown) may be disposed though the source distribution plate 158 in a symmetrical relationship to the first opening 146 to advantageously maintain axisymmetric RF distribution along the source distribution plate 158. The one or more second openings may also be used to allow access to the cavity 170 for items such as optical sensors or the like. In one or more embodiments, the backing plate assemblies described herein are particularly useful in multi-cathode PVD systems with rotating magnets. Prior art designs with larger cooling cavities limited the ability to utilize rotating magnets.

The gear box 178 may be supported by any suitable means, such as by being coupled to a bottom surface of the source distribution plate 158. The gear box 178 may be insulated from the source distribution plate 158 by fabricating at least the upper surface of the gear box 178 from a dielectric material, or by interposing an insulator layer (not shown) between the gear box 178 and the source distribution plate 158, or the like, or by constructing the motor shaft 174 out of a suitable dielectric material. The gear box 178 is further coupled to the magnet support member 172 via the gear box shaft assembly 184 to transfer the rotational motion provided by the motor 176 to the magnet support member 172 (and hence, the plurality of magnets 188).

The magnet support member 172 may be constructed from any material suitable to provide adequate mechanical strength to rigidly support the plurality of magnets 188. For example, in some embodiments, the magnet support member 172 may be constructed from a non-magnetic metal, such as non-magnetic stainless steel. The magnet support member 172 may have any shape suitable to allow the plurality of magnets 188 to be coupled thereto in a desired position. For example, in some embodiments, the magnet support member 172 may comprise a plate, a disk, a cross member, or the like. The plurality of magnets 188 may be configured in any manner to provide a magnetic field having a desired shape and strength.

Alternatively, the magnet support member 172 may be rotated by any other means with sufficient torque to overcome the drag caused on the magnet support member 172 and attached plurality of magnets 188, when present, in the cavity 170. For example, in some embodiments, (not shown), the magnetron assembly 196 may be rotated within the cavity 170 using a motor 176 and motor shaft 174 disposed within the cavity 170 and directly connected to the magnet support member 172 (for example, a pancake motor). The motor 176 must be sized sufficiently to fit within the cavity 170, or within the upper portion of the cavity 170 when the divider 194 is present. The motor 176 may be an electric motor, a pneumatic or hydraulic drive, or any other process-compatible mechanism that can provide the required torque.

Figure 2:
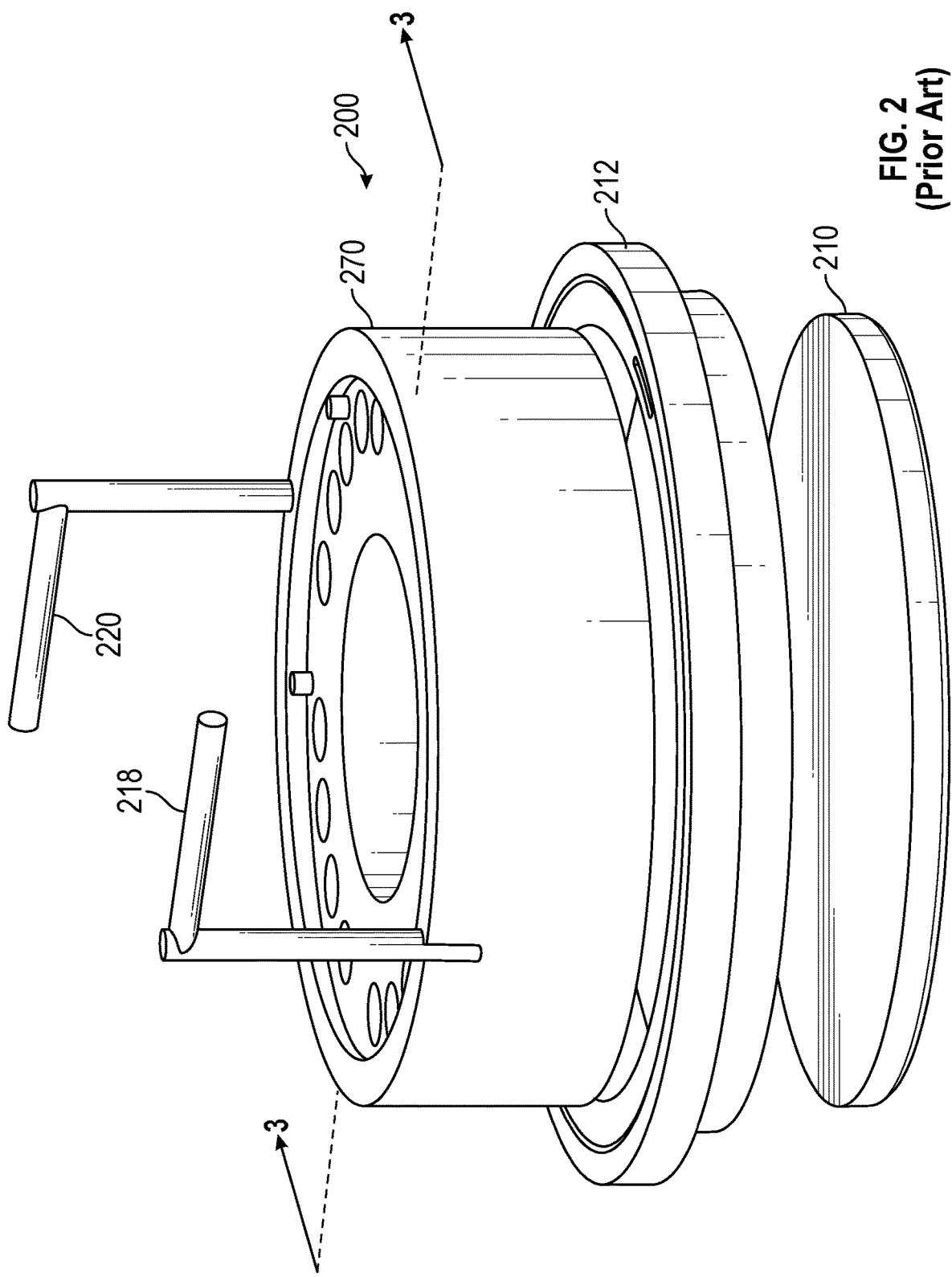
FIG. 2 illustrates a perspective view of prior art target assembly.
Figure 3:
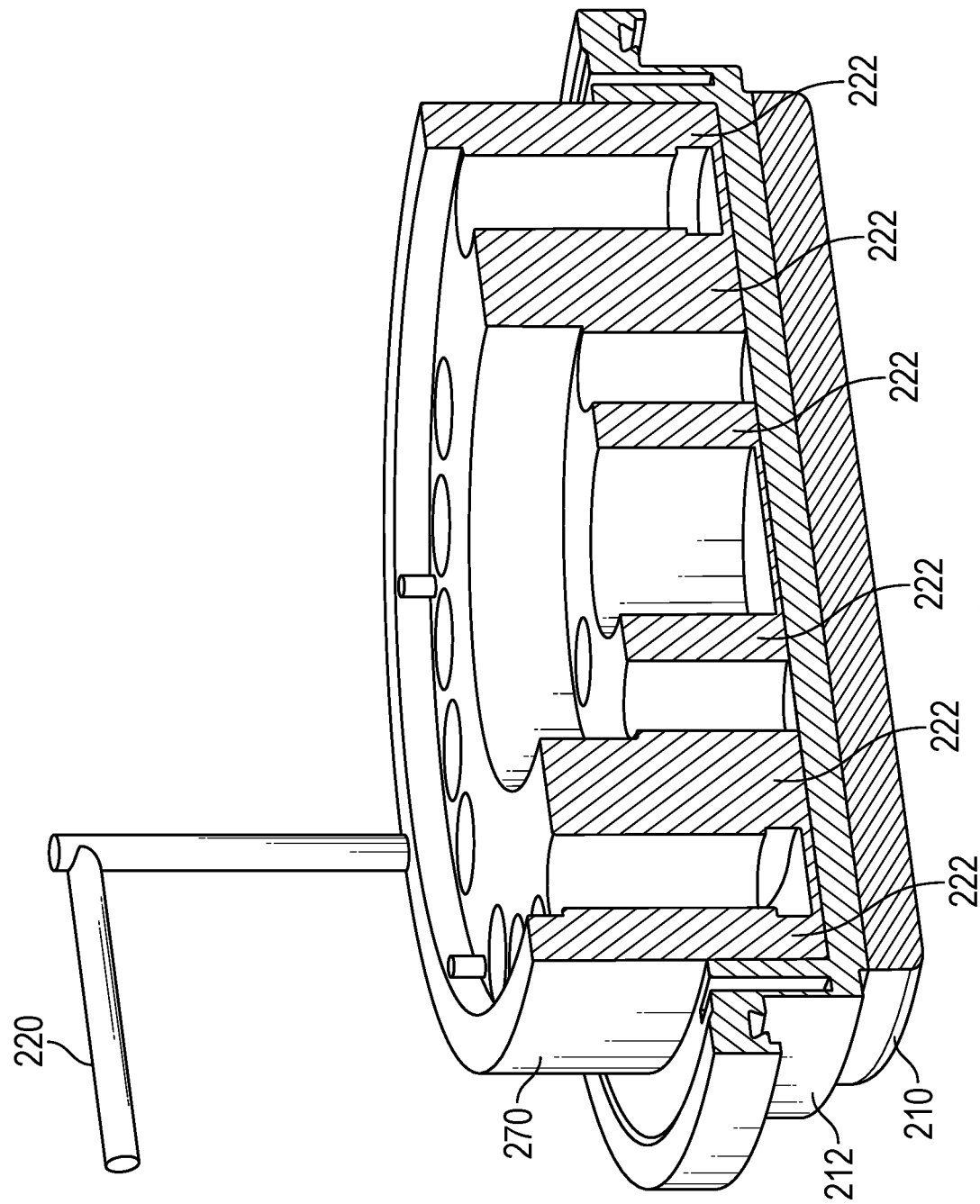
FIG. 3 illustrates a cross-sectional view taken along line 3-3 of FIG. 2.
Figure 4:
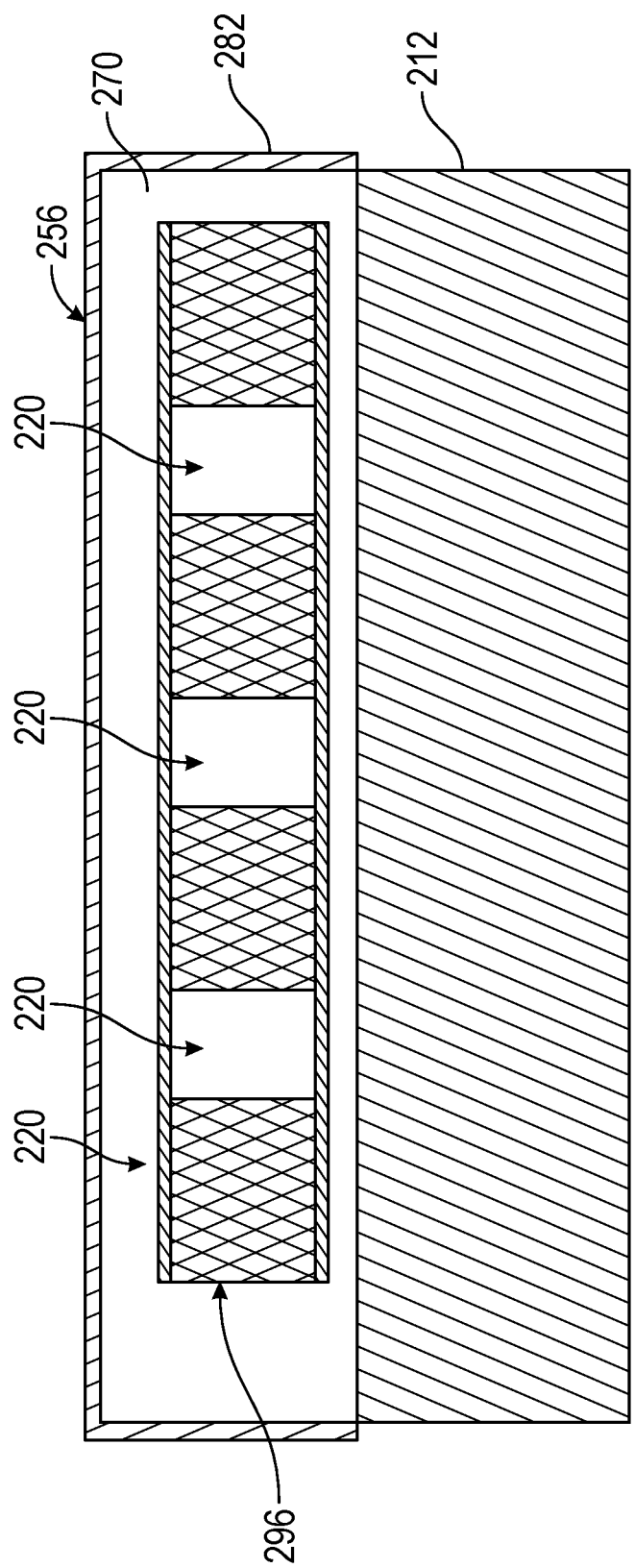
FIG. 4 illustrates a cross-sectional view of a prior art target assembly.

Referring now to FIGS. 2-4 a prior art target assembly 200 is shown, and includes a target 210, a backing plate 212, a grounding plate 256, a RF or DC power source 282 and a magnetron assembly 296 in a cavity 270 (shown in FIG. 4). The cavity 270 is a flow volume or cavity disposed between the backside of the target assembly and the source distribution plate, which also includes an extended portion of a fluid inlet end 218 and a fluid outlet end 220. In existing designs, this cavity corresponds to cavity 170 in FIG. 1, which is filled with heat exchange fluid for a target 210 cooling through backing plate 212 by flowing the heat exchange fluid over backing plate 212 without channels. FIG. 3 is a cross-sectional view taken along line 3-3 of FIG. 2 showing fluid conduits 222 formed in cavity disposed between the backside of the target assembly and the source distribution plate. FIG. 3 provides a simplified cross-sectional view of the fluid conduits 222 formed between the backside of the target assembly and the source distribution plate. In the configuration shown in FIGS. 2-4, the target 210 is cooled, but not effectively because cooling water is not replaced continuously, which causes a higher target temperature, which can lead to warping, spalling of the target, particle generation and defects.

One or more embodiments of the disclosure are directed to methods of preventing particles from falling on wafers in PVD processes. Some embodiments advantageously provide methods that intentionally charge particles and modify particle transport properties to move particles away from the wafer surface. Some embodiments advantageously provide methods for trapping charged particles in a predetermined location using plasma created by pulsed PVD generators. After the trapping point for the particles inside the plasma will be altered using one or more of pressure and wafer bias. Once the particle is transported away from the vicinity of the wafer, the plasma can be extinguished and a clean wafer can be retrieved.

In a Pulsed sputtering chamber of, for example, carbon, there is sufficient particle generation from the target due to, for example, the integrity of the layered sputtered target. In order to prevent loose particles from falling on wafers during sputtering, process conditions of frequency and power is intentionally changed to create a charge on the particle generated. These charged particles will be suspended in plasma. The higher the frequency, the less amount of time ("off-time") is given for the particles to discharge, thereby contributing to a higher trapping force due to the electrostatic force. The trapping point of the particle lies at the highest plasma density in the chamber, which is in the center of the target plasma sheath where the electrostatic force and the ion drag force balanced out. As the deposition time lengthened, clusters of particle will begin to form and grow in the trapping point of the plasma.

After the trapping location has been established, a plasma purge step at the end of the deposition process can be introduced to modify the trapping location of the cluster. By increasing the pressure of the chamber to, for example, about 96 mtorr (by, for example, increasing gas flow), the trapping location will move from the center of the target toward the outside vicinity of the wafer. The cluster particle will then follow the change of trapping point and move away from the wafers. In some embodiments, it has been observed that in approximately six seconds, the charged particle travels outside the wafer vicinity. Afterward, the plasma source power can be turned off, causing the charged particle to fall into the part of the chamber away from the wafer surface. As a result, a clean carbon wafer can be obtained.

Figure 5A:
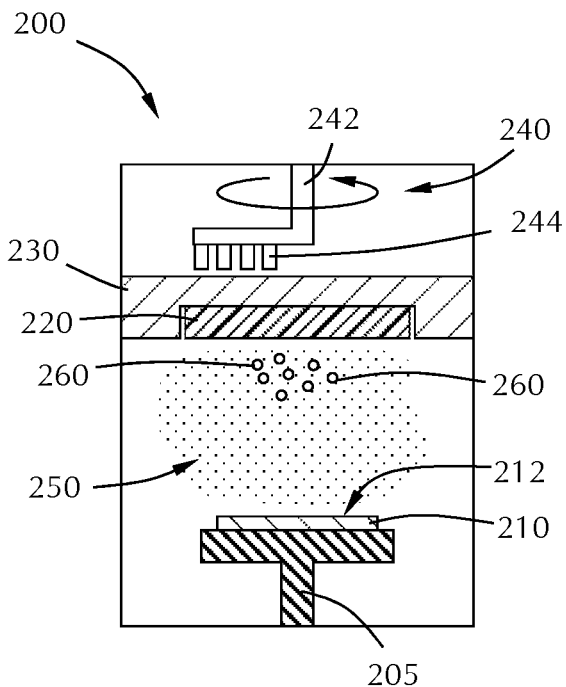
FIGS. 5A through 5C illustrate a schematic representation of a process chamber and processing method according to one or more embodiment of the disclosure.
Figure 5B:
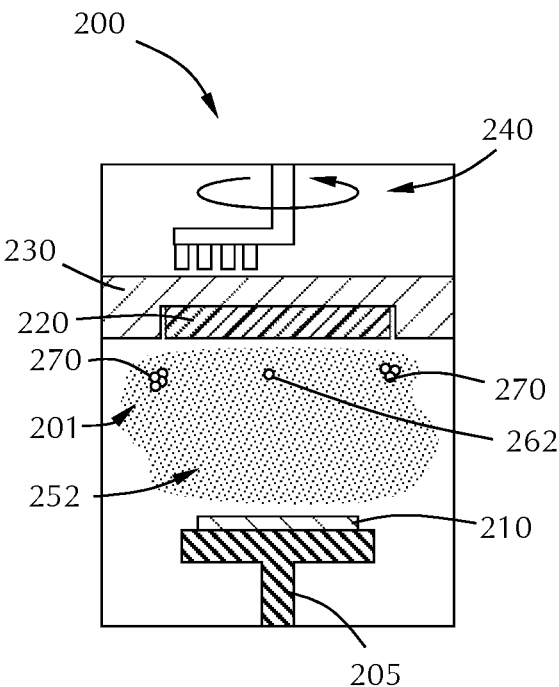
Figure 5C:
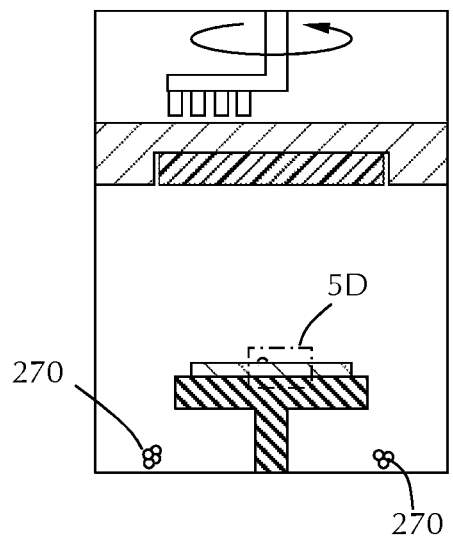
Figure 5D:
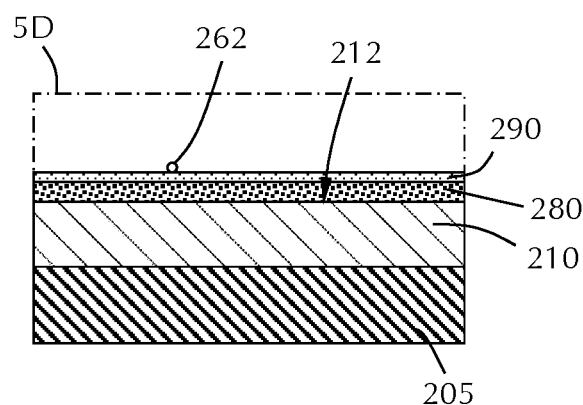
FIG. 5D illustrates an expanded view of region 5D of FIG. 5C.

In embodiments where there are small charged particles trapped in the bottom plasma sheath near the wafer surface (unaffected by the trapping point near target), the addition of voltage reversal capability in the source target (e.g., 7V at 30 us) or out of sync wafer bias can be used to create a negative potential on the wafer surface. As a result, since the charged particle is negative, it will repel and move away from the wafers due to electrostatic force Accordingly, one or more embodiments of the disclosure are directed to methods for physical vapor deposition which reduce, minimize or eliminate particle damage on the wafer surface. FIGS. 5A through 5C illustrate a schematic representation of a process according to one or more embodiment of the disclosure in a magnetron physical vapor deposition chamber 200.

In FIG. 5A, a substrate 210, also referred to as a wafer, is positioned on a pedestal 205 in the magnetron physical vapor deposition chamber 200. The substrate 210 has a surface 212 upon which a material is to be deposited (sputtered). The chamber 200 illustrated is a schematic with minimal components shown to understand the disclosure. The chamber 200 has a target 220 on a backing plate 230.

The target 220 can be any suitable material for sputtering on the substrate surface. The target 220 of some embodiments comprises, or consists essentially of, carbon. As used in this manner, the term "consists essentially of" means that the target composition is greater than or equal to about 95%, 98%, 99% or 99.5% of the stated species on an atomic basis. In some embodiments, the target 220 comprises or consists essentially one or more of carbon, silicon or germanium. In some embodiments, the film 280 deposited on the substrate 210 comprises or consists essentially of carbon and the magnetron physical vapor deposition chamber comprises a carbon target.

A magnetron assembly 240 is located adjacent the back of the target to generate a magnetic field. The magnetron assembly 240 illustrated has a rotating arm 242 with a plurality of magnets 244 (i.e., electromagnets).

A gaseous species is flowed into the interior of the chamber 200 to maintain a deposition pressure. The deposition pressure can be any suitable pressure used for sputtering known to the skilled artisan. In some embodiments, the deposition pressure is less than or equal to about 40 mtorr, 30 mtorr, 20 mtorr or 10 mtorr. A deposition plasma 250 is generated from the gaseous species using a deposition frequency and power. The deposition frequency of some embodiments is in the range of about 500 Hz to about 40 MHz.

A film 280 (see FIG. 6D) is formed on the surface 212 of the substrate 210. During sputtering, particles 260, also referred to as particulates, are formed in the deposition plasma 250. The location of the particles 260 within the chamber can vary depending on, for example, the charge of the particles. In some embodiments, the particles 260 can be maintained closer to the target 220 than the substrate 210 by applying a bias potential to the substrate 210 or pedestal 205, as will be understood by the skilled artisan.

As shown in FIG. 5B, after formation of the film 280 on the substrate 210, the pressure in the chamber 200 can be increased to a particulate purge pressure to form a particulate purge plasma 252. In some embodiments, the flow of gaseous species used to form the deposition plasma 250 is increased to change the deposition plasma 250 to a particulate purge plasma 252.

The particulate purge plasma 252 has a greater pressure than the deposition plasma 250. In some embodiments, the particulate purge pressure is greater than or equal to about 50 mtorr, 60 mtorr, 70 mtorr, 80 mtorr, 90 mtorr or 100 mtorr.

Increasing the pressure in the physical vapor deposition chamber 200 to the particulate purge pressure causes some of the particulates 260 to agglomerate 270. The agglomerates 270 can be moved to the outer portion 201 of the physical vapor deposition chamber 200. Without being bound by any particular theory of operation, it is believed that the agglomerates 270 move the outer portion 201 due to the charge of the agglomerates and the electromagnetic field generated by the rotation magnetron assembly 240. The movement of the agglomerates 270 to the outer portion 201 (outside the diameter of the substrate 210) can take as little as a few seconds.

As shown in FIG. 5B, some of the particles 262 may not form an agglomerate or may not move to the outer portion 201 of the chamber 200. While these particles 262 may fall onto the wafer surface, the disclosed method greatly reduces the number of particles that may fall onto the wafer surface.

In some embodiments, the deposition plasma 250 and the particulate purge plasma 252 are made up of the same composition, which different pressures. For example, in some embodiments, the deposition plasma 250 and the particulate purge plasma 252 comprise or consist essentially of krypton. As used in this manner, the term "consists essentially of" means that greater than or equal to about 95%, 98%, 99% or 99.5% of the plasma is made up of the stated species, on an atomic basis. In some embodiments, the plasma comprises or consists essentially of one or more of helium, neon, argon, krypton or xenon.

In some embodiments, the deposition plasma pressure is increased to the particulate purge plasma pressure by increasing the flow of the plasma gas into the chamber. In some embodiments, the particulate purge plasma pressure is maintained by a flow of plasma gas (e.g., krypton) into the chamber at a flow rate in the range of about 200 to about 3000 sccm.

In some embodiments, the particulate purge plasma is a pulsed plasma. The duty cycle of the pulsing process can be controlled to control different aspects and properties of the plasma, as will be understood by the skilled artisan. In some embodiments, the plasma has a duty cycle in the range of about 10% to about 70%, or in the range of about 20% to about 60%, or in the range of about 30% to about 50%, or about 40%.

As shown in FIG. 5C, after the agglomerates 270 have been moved to the outer portion 201 of the chamber, the plasma can be extinguished. At this point, the agglomerates 270 and any particulates 262 can fall within the chamber. The agglomerates 270 have been moved outside the diameter of the substrate 210 so fall harmlessly to the chamber bottom. The particulates 262 that remained within the inner portion of the chamber may fall onto the substrate surface. In some embodiments, after extinguishing the plasma, less particulates fall onto the substrate surface than if the pressure had not been increased from the deposition pressure to the particulate purge pressure.

Region 5D illustrates an expanded portion of the substrate 210 and the film 280 formed thereon. In some embodiments, a layer 290 of the plasma species forms on the film 280 during the particulate purge plasma process. For example, a krypton plasma may form a thin layer 290 of krypton on the film 280. The layer 290 of some embodiments has a thickness less than or equal to about 10 Å, 9 Å, 8 Å, 7 Å, 6 Å, or 5 Å. The layer 290 can be removed by subsequent processing (e.g., annealing) of the substrate.

Figure 6:
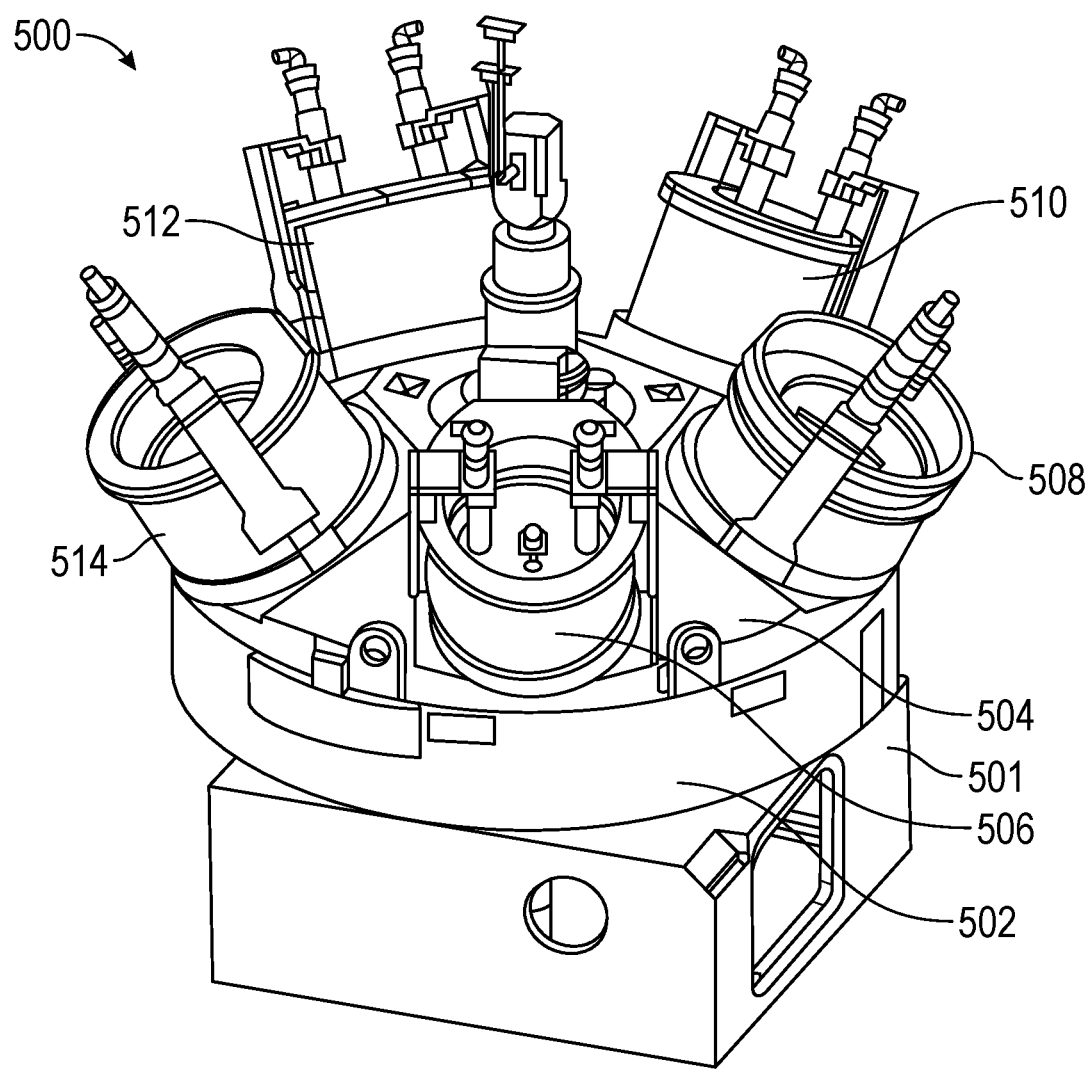
FIG. 6 illustrates a multi-cathode PVD deposition chamber according to an embodiment.

Referring now to FIG. 6, an upper portion of a multi-cathode source chamber 500 is shown in accordance with an embodiment. The multi-cathode chamber 500 includes a base structure 501 with a cylindrical body portion 502 capped by a top adapter 504. The top adapter 504 has provisions for a number of cathode sources, such as cathode sources 506, 508, 510, 512, and 514, positioned around the top adapter 504. The PVD processing system 100 described with respect to FIG. 1 can be utilized in the multi-cathode source chamber 500 to form the multilayer stack, as well as capping layers and absorber layers. For example, the physical vapor deposition systems can form layers of silicon, molybdenum, titanium oxide, titanium dioxide, ruthenium oxide, niobium oxide, ruthenium tungsten, ruthenium molybdenum, ruthenium niobium, chromium, tantalum, nitrides, compounds, or a combination thereof. Although some compounds are described as an oxide, it is understood that the compounds can include oxides, dioxides, atomic mixtures having oxygen atoms, or a combination thereof.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A physical vapor deposition method comprising:
depositing a film comprising carbon on a substrate surface in a magnetron physical vapor deposition chamber with a plasma at a deposition pressure and creating particles in the plasma, the magnetron physical vapor deposition chamber having a magnetron assembly comprising a rotatable drive shaft having a location that is aligned with a central axis of the chamber, the location of the rotatable drive shaft fixed with respect to the central axis of the chamber, a plurality of magnets that are coupled to a magnet support member connected to the rotatable drive shaft to rotate around the central axis, a first energy source comprising a first RF bias power source to provide RF power, to a carbon target at a first frequency, and a second energy source comprising a second RF bias power source to provide RF power to the carbon target at a second frequency, the second frequency different than the first frequency;
increasing pressure in the physical vapor deposition chamber to a particulate purge pressure greater than or equal to about 50 mtorr to move at least some of the particles to an outer portion of the physical vapor deposition chamber, wherein the substrate surface is biased while increasing the pressure to keep particles suspended in the plasma, wherein moving at least some of the particles comprises increasing the frequency of the bias applied to the substrate surface to create a charge on at least some of the particles to form charged particles, and increasing the frequency creates a trapping force that decreases an amount of time for the charged particles to discharge; and
extinguishing the plasma.

2. The method of claim 1, wherein the plasma comprises krypton.

3. The method of claim 2, wherein the krypton is flowed into the chamber at a flow rate in the range of about 200 to about 3000 sccm.

4. The method of claim 3, wherein a layer of krypton forms on the film.

5. The method of claim 4, wherein the layer has a thickness less than or equal to about 10 Å.

6. The method of claim 1, wherein the plasma is pulsed.

7. The method of claim 6, wherein the plasma has a frequency of about 13.56 MHz.

8. The method of claim 6, wherein the plasma is pulsed with a duty cycle in the range of about 20% to 60%.

9. The method of claim 6, wherein the plasma is pulsed with a duty cycle of about 40%.

10. The method of claim 1, wherein at the particulate purge pressure, particulates suspended in the plasma agglomerate to form larger particle sizes.

11. A physical vapor deposition method comprising:
positioning a substrate having a substrate surface on a pedestal in a magnetron physical vapor deposition chamber, the magnetron physical vapor deposition chamber having a magnetron assembly comprising a rotatable drive shaft having a location that is aligned with a central axis of the chamber, the location of the rotatable drive shaft fixed with respect to the central axis of the chamber, a plurality of magnets that are coupled to a magnet support member connected to the rotatable drive shaft to rotate around the central axis, a first energy source comprising a first RF bias power source to provide RF power to a carbon target at a first frequency, and a second energy source comprising a second RF bias power source to provide RF power to the carbon target at a second frequency, the second frequency different than the first frequency;
generating a deposition plasma at a deposition pressure in the chamber to deposit a film comprising carbon on the substrate surface and create particulates in the plasma; and
increasing pressure in the chamber to a particulate purge pressure greater than or equal to about 70 mtorr to agglomerate particulates in the plasma and move the agglomerated particulates to an outer portion of the physical vapor deposition chamber, wherein the pedestal is biased during deposition and at the particulate purge pressure, wherein moving the agglomerated particulates comprises increasing the frequency of the bias applied to the pedestal to create a charge on at least some of the particulates to form charged particulates, and increasing the frequency creates a trapping force that decreases an amount of time for the charged particulates to discharge.

12. The method of claim 11, wherein the deposition plasma comprises krypton.

13. The method of claim 12, wherein the krypton is flowed into the chamber at a flow rate in the range of about 200 to about 3000 sccm.

14. The method of claim 13, wherein a layer of krypton forms on the film.

15. The method of claim 14, wherein the layer has a thickness less than or equal to about 10 Å.

16. A physical vapor deposition method comprising:
    positioning a substrate having a substrate surface on a pedestal in a magnetron physical vapor deposition chamber, the magnetron physical vapor deposition chamber comprising a magnetron assembly comprising a rotatable drive shaft having a location that is aligned with a central axis of the chamber, the location of the rotatable drive shaft fixed with respect to the central axis of the chamber, a plurality of magnets that are coupled to a magnet support member connected to the rotatable drive shaft to rotate around the central axis, a first energy source comprising a first RF bias power source to provide RF power to a target assembly comprising a carbon target at a first frequency, and a second energy source comprising a second RF bias power source to provide RF power to the target assembly at a second frequency, the second frequency different than the first frequency;
    depositing a film comprising carbon on the substrate surface by generating a deposition plasma at a deposition pressure less than or equal to about 40 mtorr in the chamber, depositing the film creates particulates in the plasma; and
    decreasing particulates falling on the substrate surface by increasing pressure in the chamber to a particulate purge pressure greater than or equal to about 70 mtorr to agglomerate particulates in the plasma and move the agglomerated particulates to an outer portion of the physical vapor deposition chamber, wherein the pedestal is biased during deposition and at the particulate purge pressure, wherein moving the agglomerated particulates comprises increasing the frequency of the bias applied to the pedestal to create a charge on at least some of the particulates to form charged particulates, and increasing the frequency creates a trapping force that decreases an amount of time for the charged particulates to discharge.

17. The method of claim 16, wherein after extinguishing the plasma, fewer particulates fall onto the substrate surface than if the pressure was not increased from the deposition pressure and the frequency was not increased to form charged particulates.

\* \* \* \* \*